United States Patent [19]

Prager et al.

[11] 4,288,839
[45] Sep. 8, 1981

[54] SOLID STATE DEVICE MOUNTING AND HEAT DISSIPATING ASSEMBLY

[75] Inventors: Jay M. Prager, Nashua, N.H.; Joseph F. Sadlow, North Reading; John K. Nitzsche, Concord, both of Mass.

[73] Assignee: Gould Inc., Rolling Meadows, Ill.

[21] Appl. No.: 85,969

[22] Filed: Oct. 18, 1979

[51] Int. Cl.³ .............................................. H05K 7/20
[52] U.S. Cl. .................................. 361/386; 361/387; 357/81
[58] Field of Search ................... 339/112 R; 165/80 B, 165/185; 174/16 HS; 357/79, 81; 361/386–389

[56] References Cited

U.S. PATENT DOCUMENTS

| 3,261,904 | 7/1966 | Wulc | 165/80 B |
| 3,376,920 | 4/1968 | Lazarus | 165/80 B |
| 3,519,889 | 7/1970 | Monaco | 174/16 HS |
| 4,103,321 | 7/1978 | Gansert | 361/388 |
| 4,167,031 | 9/1979 | Patel | 361/386 |
| 4,215,361 | 7/1980 | McCarthy | 174/16 HS |

Primary Examiner—Gerald P. Tolin
Attorney, Agent, or Firm—Mattern, Ware, Stoltz & Fressola

[57] ABSTRACT

By providing a retaining surface, upon which a solid state device is positioned, and a device securing means movable into and out of compression engagement with a portion of the solid state device, for securely mounting and retaining the device in sandwiched interengagement between the securing means and the retaining surface, a unique solid state device mounting assembly is achieved which eliminates fastening means extending through the solid state device for secure mounting thereof. In addition, the assembly incorporates heat dissipating means cooperatingly associated with the retaining surface for absorbing and dissipating heat generated by the solid state device. In the preferred embodiment, an elongated unitary one-piece bracket member is employed for securely mounting a plurality of solid state devices in the single bracket member, with the bracket member being mountable to a heat dissipating surface.

12 Claims, 4 Drawing Figures

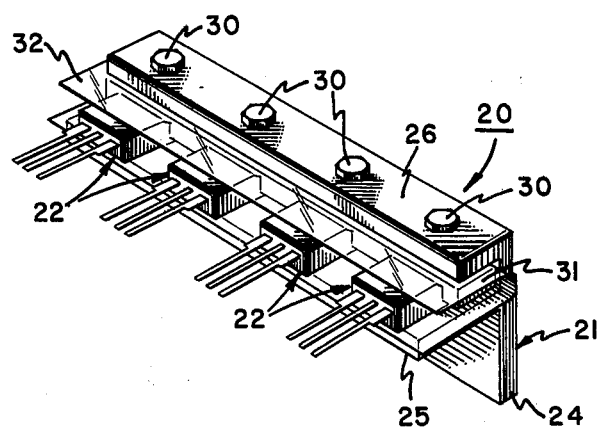
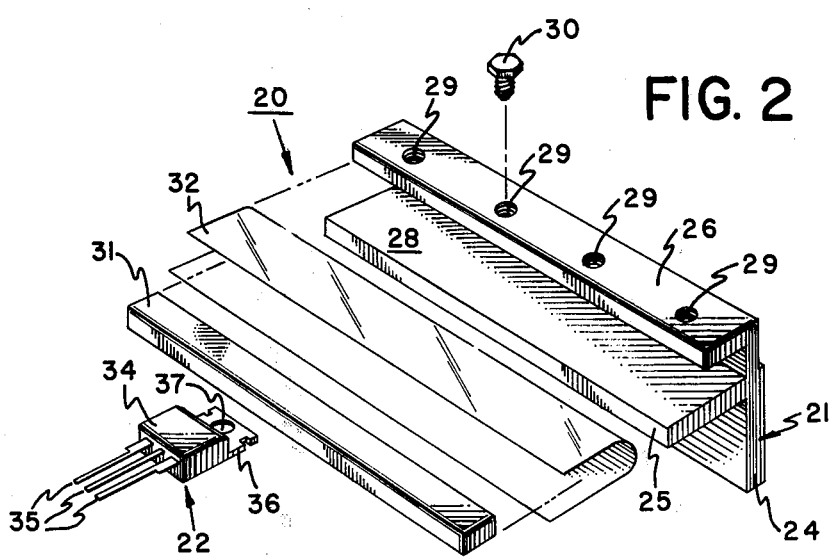
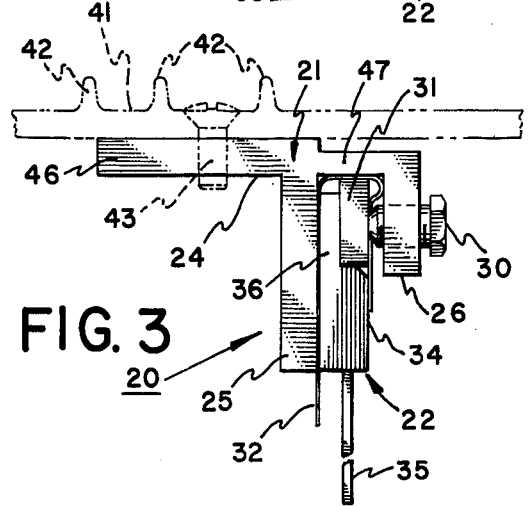
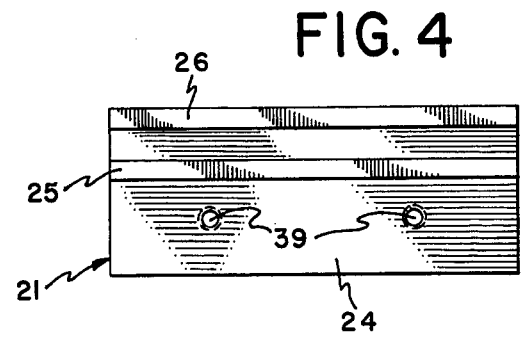

SOLID STATE DEVICE MOUNTING AND HEAT DISSIPATING ASSEMBLY

TECHNICAL FIELD

This invention relates to a mounting assembly for solid state devices and more particularly to a heat absorbing and heat dissipating structure for securely mounting a plurality of solid state devices.

BACKGROUND ART

It is well known in the electronic art that many solid state devices generate a considerable amount of heat which must be dissipated away from the solid state device in order to prevent failures. In order to assist with this heat dissipation or "heat sinking," many of these solid state devices are manufactured integrally mounted to a substantially flat metal plate, a portion of which extends beyond the device's main body, forming a metal tab-like construction which incorporates a through hole near its exposed end. Generally, the electrodes of the solid state device protrude in a direction opposite from the direction of the exposed apertured metal tab.

In mounting these solid state devices, the exposed apertured metal tab is employed with fastening means for directly anchoring the solid state device to a holding plate, constructed for absorbing and dissipating the heat generated by the solid state device. This type of construction and mounting system is generally employed throughout the industry in the manufacture of a wide variety of products. In U.S. Pat. No. 3,641,474, this conventional structure is discussed and clearly shown. In addition to this conventional anchoring system, this patent also employs restraining blocks for preventing the rotation of the solid state device about the axis of the anchoring screw when the solid state device is being affixed to the heat sinking plate.

Although this conventional system does provide suitable heat sinking capability for the heat generated by these solid state devices, the direct fastening of the apertured metal tab to a mounting plate creates additional problems which have heretofor gone completely unresolved. This major problem is controlling the spacing between the electrically live apertured metal tab of the solid state device and the metal heat sinking plate.

It is well known that where electrically live parts are employed in close proximity to grounded or floating conductive parts, the distance or "spacing" between the live parts and the grounded or floating conductive parts is an important design perimeter which must comply with minimum acceptable standards in order to assure the safety and reliability of the system. The minimum spacing is required to avoid arcing from live parts to the grounded parts and shorting of live parts to grounded or floating conductive parts. In addition the minimum spacing also prevents potential fire and safety hazards from occuring due to electrical leakage current flowing between the live parts and adjacent grounded parts as a result of contamination of surfaces between these parts.

In determining compliance of standards for minimum acceptable spacing, both the "through air" and "over surface" spacing must be considered. As a result, in conventional mounting of solid state devices to suitable heat sinking surfaces, insulators are employed to comply with these minimum acceptable standards for through air and over surface spacings.

As shown in U.S. Pat. No. 3,641,474, compliance with these standards requires the use of a dielectric sheet between the semi-conductor and the heat sinking plate, as well as an insulating bushing passing through the apertured metal tab in order to achieve sufficient insulation of the anchoring screw from the heat sinking plate. As is readily apparent to one skilled in this art, this construction is extremely disadvantageous since a large number of small hand assembled parts is required.

Another problem which exists with these prior art mounting systems is the difficulty of accommodating the varying dimensions of the necessary parts. Since these parts are all mass produced, the tolerance on the thickness of items such as the metal tab or the thickness of the insulating bushings are not closely controlled. As a result, the thickness of one metal tab or bushing can be very different from the next.

These variations become a critical problem when these devices must be mounted to the heat sink plate within a specific tolerance to prevent electrical conduction to the heat sink plate. When the allowed tolerance is small, these variations can present time consuming and costly problems.

Therefore, it is the principle object of the present invention to provide a solid state device mounting assembly that securely maintains the solid state device in position without employing fastening means extending through the solid state device.

Another object of the present invention is to provide a solid state device mounting assembly having the characteristic features defined above which is capable of simultaneously holding a plurality of solid state devices in a single easily assembled module.

Another object of the present invention is to provide a solid state device mounting assembly having the characteristic features defined above which is capable of transferring the heat generated by the solid state devices to a suitable heat dissipating surface.

Another object of the present invention is to provide a solid state device mounting and heat dissipating assembly having the characteristic features described above which is both easy and inexpensive to manufacture.

Another object of the present invention is to provide a solid state device mounting and heat dissipating assembly having the characteristic features described above which is quickly and easily assembled and installed in an operating system.

Other more specific objects will in part be obvious and will in part appear hereinafter.

DISCLOSURE OF INVENTION

The prior art difficulties and limitations have been obviated by the present invention providing a solid state device mounting and heat dissipating assembly which securely maintains either one or a plurality of solid state devices in a fixed position by compression mounting of the solid state device. The present invention eliminates the problems that have previously plagued producers of electronic products incorporating solid state devices wherein heat generation and dissipation is a problem, by providing a solid state device mounting assembly which is capable of securely holding and fastening any number of solid state devices in position without requiring fastening means or holding means which extend through the aperture formed in the metal tab of the solid state device. In addition, the solid state device mounting assembly of this invention also incorporates heat dissipating means in order to assure the absorption and thermal dissipation of the heat generated by the solid state devices, thereby eliminating any thermal breakdown of the solid state device, without requiring large bulky containers.

Although the present invention can be practiced in a variety of different constructions, an assembly employing the teaching of this invention must incorporate a mounting surface on which the individual or the plurality of solid state devices are supportingly retained. In addition, solid state device securing means must also be incorporated, with the securing means being positioned in juxtaposed spaced facing relationship to the device retaining surface and movable into and out of force applying holding engagement with the mounting portion of the solid state device.

Generally, the solid state devices incorporate exposed metal tabs to which the force of the securing means is applied. In this way, secure, frictional, mounting engagement of the solid state device is assured with the metal tab of the device securely "sandwiched" between the securing means and the retaining surface. In addition, the thickness variations in the metal tabs of the solid state device present no problem, since this sandwiched construction of this invention is able to automatically compensate for any variations.

Preferably, a nonconductive, elongated compression bar is employed between the metal tab of the solid state device and the device securing means. By employing a compression bar, the application of the holding force in a uniform, consistent, equally distributed manner is assured. Also, a thin sheet of an electrical insulating material is preferably incorporated into the assembly of the present invention, peripherally surrounding the solid state device and the elongated compression bar, in order to prevent the conduction of any electrical signal to the retaining surface or the device securing means.

In order to provide the solid state device mounting assembly of this invention with heat dissipating capabilities, the retaining surface is cooperatingly associated with heat conducting means which, either independently or in combination with an external heat dissipating surface, provides the requisite heat absorption and dissipation away from the solid state devices.

In the preferred construction, the solid state device retaining surface and the device securing means are formed on a single unitary structure, along with a heat conducting plate which is readily mountable to an external heat dissipating surface. With this unitary construction, the entire solid state device mounting and heat dissipating assembly of the present invention requires only the unitary member, the compression bar, and the sheet of nonconductive material.

In an alternative construction, the device securing means and retaining surface are integrally formed with the heat dissipating surface. In this way, one single structure need be employed for ease of assembly.

With these components, either a one or a plurality of solid state devices are quickly and easily securely mounted together, ready for operation. In addition to ease of construction, the assembly of the present invention provides assurance that the metal tab of the solid state device is spaced away from the retaining surface in full compliance with all minimum standards for reliability and safety.

The invention accordingly comprises the features of construction, combination of elements, and arrangement of parts which will be exemplified in the construction hereinafter set forth, and the scope of the invention will be indicated in the claims.

THE DRAWINGS

For a fuller understanding of the nature and objects of the invention, reference should be had to the following detailed description taken in connection with the accompanying drawings, in which:

FIG. 1 is a perspective view of the preferred embodiment of the solid state device mounting and heat dissipating assembly of the present invention;

FIG. 2 is an exploded perspective view of the preferred embodiment of the solid state device mounting and heat dissipating assembly of the present invention;

FIG. 3 is a side elevation view of the preferred embodiment of the solid state device mounting and heat dissipating assembly of the present invention shown mounted to an external heat dissipating surface which is shown in phantom; and FIG. 4 is a front elevation view of the preferred unitary bracket member of the solid state device mounting and heat dissipating assembly of the present invention.

BEST MODE FOR CARRYING OUT THE INVENTION

In FIG. 1, the preferred embodiment of the solid state device mounting and heat dissipating assembly 20 of the present invention is shown fully constructed, while FIG. 2 clearly shows each of the components forming the assembly 20. In this preferred embodiment, solid state device mounting and heat dissipating assembly 20 incorporates a single bracket member 21, to which either a single or a plurality of solid state devices 22 are securely engaged.

Preferably, bracket 21 comprises an elongated unitary extrusion incorporating a main wall portion 24 and two flange members 25 and 26 extending from wall portion 24 in juxtaposed spaced facing relationship to each other. Flange 26 incorporates a plurality of threaded holes 29 positioned longitudinally along flange 26, with each of said hole 29 having its central axis substantially perpendicular to flange 25. In addition, each of the holes 29 incorporates a screw 30 threadedly engaged therein. If desired, a plurality of unthreaded holes may be employed for use with self-tapping screws.

In this preferred embodiment, the solid state device mounting and heat dissipating assembly of this invention is fully completed by incorporating, in addition to bracket 21, a compression bar 31 and a nonconductive sheet 32. As is readily apparent, the entire assembly employs a minimum number of components.

As best seen in FIG. 2, solid state device 22 comprises a main body portion 34 with electrodes 35 extending from one end of body portion 34. In addition, body portion 34 is integrally mounted with a substantially flat metal tab 36 which extends from body portion 34 in a direction opposite from electrodes 35. Substantially flat metal tab 36 incorporates an aperture 37 formed in the upper surface of tab 36. As discussed above, this construction is typical of many solid state devices which generate heat during their use, with metal tab 36 being employed to supportingly hold the solid state device, securely mount the device to a heat dissipating body, and provide a suitable path for removing heat from the internal solid state element to a suitable large dissipating surface.

By referring to FIGS. 1, 2 and 3, the quick and easy assembly of a plurality of solid state devices 22 into secure retained supporting engagement in device mounting and heat dissipating assembly 20 can best be understood. First, insulating sheet 32 is installed in the cavity formed by flange members 25 and 26. Then, each solid state device 22, which is to be securely mounted in assembly 20, is placed on insulating sheet 32 which rests on retaining surface 28 of flange 25. As is clearly shown in the drawings, solid state device 22 is positioned on retaining surface 28, with insulating sheet 32 therebetween, with the body portion 34 of device 22 facing away from surface 28. This arrangement assures that the rear surface of the substantially flat metal tab 36 is entirely in juxtaposed facing relationship with surface 28 of flange 25.

Once each of the solid state devices 22 have been supportingly positioned on surface 28 of flange 25 in the manner detailed, elongated compression bar 31 is placed between flange 25 and flange 26 in substantially longitudinal alignment therewith, resting directly on the exposed upper surface of the metal tabs 36 of each of the solid state devices 22. The assembly is then quickly and easily completed, by threadedly advancing each screw 30 towards compression bar 31. This screw advance causes compression bar 31 to move into secure, abutting, frictionally engagement with metal tabs 36 of solid state devices 22, retainingly securing metal tabs 36 in direct sandwiched engagement between bar 31 and flange 25.

If desired, insulating sheet 32 could be eliminated by positioning an elongated spacer plate, between flange 25 and tabs 36 of solid state devices 22, with the plate being electrically non-conductive and thermally conductive. The only requirement would be that the spacer bar be constructed to provide the requisite electrical "spacing" insulation to meet the industry standards.

By employing the solid state device mounting and heat dissipating assembly of this invention, a plurality of solid state devices are quickly and easily simultaneously securely mounted in a supporting and holding assembly without requiring the passage of any fastening means through aperture 37 of metal tab 36. In addition, each solid state device 22 and its accompanying electrically live metal tab 36 are securely retained with all minimum spacing standards being fully and completely met, thereby assuring a safe and hazard free assembly. Also, any thickness variations in metal tabs 36 of solid state device 22 is easily and automatically accommodated.

For added protection, the preferred embodiment of the solid state device mounting and heat dissipating assembly of the present invention incorporates a thin sheet of an electrical insulating material which is positioned between flange 25 and flange 26, peripherally surrounding solid state devices 22 and spacer bar 31. In this way, any electrical conduction from solid state device 22 to bracket 21 is eliminated and compliance with industry spacing standards is achieved, since the electrical spacing between electrically live tab 36 of solid state device 22 and metal bracket 21 is entirely dependent on the dimensions on the surface of insulating sheet 32.

Preferably, this insulating sheet is made from Kapton or Mylar. However, any suitable insulating medium may be employed, depending upon the particular application. For additional protection, compression bar 31 preferably comprises an electrical insulating phenolic resin, thereby providing a rigid substantially non-deformably bar which is also electrically nonconductive. However, any suitable electrically non-conductive material may be employed, depending upon the particular application.

Although unitary, elongated bracket member 21 incorporates a heat absorbing and heat dissipating wall member 24 which is integrally connected to heat absorbing flange 25, additional capability must usually be provided for absorbing and dissipating the heat from wall portion 24 to the outside surrounding environment. In order to provide this requisite external heat sinking capability, bracket 21 is constructed for direct, easy mounting to external heat sinking surface 41, as shown in FIG. 3. External heat sinking surface 41 incorporates a plurality of longitudinally extending fins 42 which provide the necessary surface area for absorbing the heat from wall 24 and dissipating the heat to the outside environment. In another embodiment of this invention, flanges 25 and 26 are formed with heat dissipating surface as a unitary structure. This unitary structure is easily achieved by extrusion, casting, or machining of the flanges with the requisite heat dissipating surface.

As shown in FIG. 4, bracket 21 incorporates two mounting holes 39 found in wall portion 24. Mounting holes 39 are employed for the secure mounting engagement of bracket 21 to external heat dissipating surface 41. As shown in FIG. 3, the mounted interengagement is quickly and easily achieved by employing screw means 43 which pass through external heat dissipating surface 41 and are threadedly engaged in holes 39 of bracket 21.

As best seen in FIG. 3, wall portion 24 of bracket 21 incorporates two separate sections 46 and 47, with section 46 being substantially thicker than section 47. In the preferred construction, this dual thickness wall construction is employed in order to prevent deformation of surface 24 when screws 30 are torqued in place, thereby providing optimum heat transfer between surface 24 and member 41.

Each screw 30 is torqued to a force of 10 to 145 inch-ounces, depending upon the method of assembly employed. The force resulting from torquing screws 30 into their final position tends to produce a bending moment which deforms section 47, causing it to bend upward.

It has been found that when section 47 and 46 have the same width, the maintenance of an optimum flat surface contact between surface 24 and member 41 become impossible, due to this deforming bending force. However, by providing section 47 of wall member 24 with a thinner structure than section 46, space is provided for acceptance of the bending deformation of section 47 without interfering with the surface flatness of section 46 and its heat transfer contact area with heat dissipating surface 41.

It should be readily apparent to one skilled in the art that the solid state device mounting and heat dissipating assembly of this invention could be manufactured in a great variety of alternative constructions, while still employing the disclosure contained herein. One such obvious variation would be to substitute for the plurality of screws 30, a force applying system which is controlled by a single movable element that advances towards and away from retaining surface 25 to provide the necessary compressive force. Although screws 30 are employed for their simplicity, ease, and comparative minimal expense, any such variations must be considered to be within the purview and scope of this invention.

It will best be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. A heat dissipating and solid state device mounting assembly adapted for securely holding heat generating solid state devices and for absorbing and dissipating said heat, the assembly comprising
    A. a solid state device retaining surface
        a. supportingly holding solid state devices removably positioned thereon, and
        b. being capable of absorbing heat generated by solid state devices secured thereto;
    B. heat dissipating means conductively engaged with the device retaining surface for absorbing heat therefrom and directing the heat for remote dissipation; and
    C. solid state device securing means
        a. positioned in juxtaposed spaced facing relationship to the solid state device retaining surface, and
        b. in movable holding engagement of the solid state devices against said retaining surface,
    D. a compression bar positioned between the solid state devices and the device securing means for receiving the holding force of the securing means and applying said force substantially equally to the solid state devices;
    E. a thin of an electrical nonconductor, peripherally surrounding and enveloping the solid state devices and the compression bar, thereby assuring no electrical conduction from said solid state devices to either the device retaining surface or the device securing means, while also maintaining the desired electrical spacing;

whereby the solid state devices are securely supportingly maintained in supporting contact with the device retaining surface by being sandwiched between the device securing means and said device retaining surface, thereby completely eliminating any need for fastening means extending through a mounting portion of the solid state device.

2. The heat dissipating and solid state device mounting assembly defined in claim 1, wherein said sheet of insulating material comprises one selection from the group consisting of Kapton and Mylar.

3. The heat dissipating and solid state device mounting assembly defined in claim 1, wherein said compression bar is manufactured from a nonconductive phenolic resin.

4. The heat dissipating and solid state device mounting assembly defined in claim 1, wherein said device retaining surface, said heat dissipating means, and said device securing means are all formed on a unitary, integral member.

5. The heat dissipating and solid state device mounting assembly defined in claim 4, wherein said unitary, integral member comprises
    F. an elongated bracket structure incorporating
        a. a central elongated wall portion forming the heat dissipating means,
        b. a first flange extending from one edge of said wall portion and being engaged with the securing means, and
        c. a second flange extending from said wall portion substantially parallel to said first flange and in juxtaposed spaced facing relationship to said first flange, one surface of which defines the retaining surface.

6. The heat dissipating and solid state device mounting assembly defined in claim 5, wherein said first flange also incorporates a plurality of holes having a central axis substantially perpendicular to said second flange, with each of said holes incorporating a screw member engaged therein, whereby advance of the screws towards the second flange provides the requisite force for holding engagement of the solid state devices.

7. The heat dissipating and solid state device mounting assembly defined in claim 5, wherein said wall portion is further defined as comprising
    1. a first section extending between the first flange and the second flange, and
    2. a second section integral with the first section and extending therefrom away from said second flange and comprising a greater thickness than the first section,
whereby excessive torquing of said set screws is harmlessly absorbed by bending deformation of said first section.

8. The heat dissipating and solid state device mounting assembly defined in claim 7, wherein the second section of the wall portion is further defined as incorporating mounting means for securely attaching the entire bracket to an external heat dissipating surface.

9. A heat dissipating and solid state device mounting system securely holding and maintaining a plurality of heat generating solid state devices, each having a metal mounting tab extending therefrom, and for absorbing and dissipating the heat generated from said solid state devices, the assembly comprising
    A. an elongated, unitary bracket member incorporating
        a. a central wall portion,
        b. a first flange
            1. extending from a terminating edge of said wall portion, and
            2. incorporating solid state device securing means in movable holding engagement with the solid state devices, and
        c. a second flange
            1. extending from the wall portion substantially parallel to the first flange and in juxtaposed spaced facing relationship thereto, and
            2. incorporating a solid state device retaining surface supportingly holding a plurality of said solid state devices positioned thereon;
    B. heat dissipating means conductively engaged with the central wall portion and the second flange for absorbing and dissipating heat generated by the solid state devices, and
    C. an elongated compression bar
        1. positioned between the first flange and the mounting tabs of the solid state devices, and 2. aligned with the solid state device securing means for controlled movement therewith into and out of direct force applying holding engagement of said solid state devices, whereby a plurality of solid state devices are securely frictionally mounted directly along their mounting tabs to the retaining surface of the second flange by sandwiching the metal tabs between the compression bar and the second flange, thereby assuring secure mounting engagement of the plurality of solid state devices, simultaneously and without requiring any fastening means extending through the mounting tabs of the solid state devices.

10. The heat dissipating and solid state device mounting assembly defined in claim 9, wherein said assembly further comprises
    D. a thin sheet of electrical insulating material positioned between the first and second flange peripherally surrounding and partially enveloping the plurality of solid state devices and the compression bar, thereby assuring no conduction of electricity from said solid state devices to said bracket member.

11. The heat dissipating and solid state device mounting assembly defined in claim 9, wherein said central wall portion incorporates mounting means for providing quickly assembled, direct mounting of the bracket member to an external heat dissipating surface.

12. The heat dissipating and solid state device mounting assembly defined in claim 9, wherein the solid state device securing means to said first flange is further defined as comprising
    (i) a plurality of threaded holes formed in said first flange having a central axis substantially perpendicular to said second flange, and
    (ii) a plurality of set screws threadedly engaged in each of said holes for controlled movement of the conpression bar, whereby rotation of the set screws towards the second flange causes the compression bar to firmly abutt and frictionally engage the mounting tab of the solid state devices and, when the set screws have been torqued to the desired limit, assures that the compression bar exerts sufficient force on the metal tabs of the solid state devices to provide sandwich interengaged frictional mounting of the metal tabs between the compression bar and the device retaining surface of the second flange.

* * * * *